US010790808B2

(12) United States Patent
Mu

(10) Patent No.: US 10,790,808 B2
(45) Date of Patent: Sep. 29, 2020

(54) VARIABLE DELAY CIRCUITS

(71) Applicant: Telefonaktiebolaget LM Ericsson (publ), Stockholm (SE)

(72) Inventor: Fenghao Mu, Hjarup (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/477,881

(22) PCT Filed: Jan. 24, 2017

(86) PCT No.: PCT/EP2017/051355
§ 371 (c)(1),
(2) Date: Jul. 13, 2019

(87) PCT Pub. No.: WO2018/137751
PCT Pub. Date: Aug. 2, 2018

(65) Prior Publication Data
US 2020/0127651 A1 Apr. 23, 2020

(51) Int. Cl.
| H03K 3/00 | (2006.01) |
| H03K 5/00 | (2006.01) |
| H03K 19/00 | (2006.01) |
| H03K 5/134 | (2014.01) |
| H03K 3/356 | (2006.01) |

(Continued)

(52) U.S. Cl.
CPC ............ H03K 5/134 (2014.07); H03K 3/356 (2013.01); H03K 5/135 (2013.01); H03K 5/1504 (2013.01)

(58) Field of Classification Search
CPC ...... H03K 5/134; H03K 5/1504; H03K 3/356; H03K 5/135
See application file for complete search history.

(56) References Cited

U.S. PATENT DOCUMENTS 5,034,629 A * 7/1991 Kinugasa ......... H03K 19/00361
326/121
5,093,586 A * 3/1992 Asari ................... G11C 16/30
327/306

(Continued)

FOREIGN PATENT DOCUMENTS

| EP | 3038257 A1 | 6/2016 |
| WO | 9715116 A2 | 4/1997 |

OTHER PUBLICATIONS

PCT International Search Report, dated Oct. 9, 2017, in connection with International Application No. PCT/EP2017/051355, all pages.

(Continued)

*Primary Examiner* — Kenneth B Wells
(74) *Attorney, Agent, or Firm* — Patent Portfolio Builders, PLLC

(57) ABSTRACT

A passable latch circuit and variable delay chains built with one or more passable latch circuits are disclosed. The passable latch circuit has a dynamic latch including a first P-transistor, a first N-transistor, a second P-transistor, a second N-transistor and a clock input circuitry. The passable latch circuit further includes a control switch connected between the gates of the second P-transistor and the second N-transistor. The control switch has an on state and an off state, and the passable latch circuit is configured to have different delays by controlling the state of the control switch.

16 Claims, 13 Drawing Sheets

(51) Int. Cl.
*H03K 5/135* (2006.01)
*H03K 5/15* (2006.01)

(56) References Cited

U.S. PATENT DOCUMENTS

| | | | | |
|---|---|---|---|---|
| 5,120,992 | A * | 6/1992 | Miller | H03K 19/00361 |
| | | | | 327/111 |
| 5,138,194 | A * | 8/1992 | Yoeli | H03K 17/166 |
| | | | | 326/33 |
| 5,140,194 | A * | 8/1992 | Okitaka | H03K 19/0013 |
| | | | | 326/121 |
| 5,233,238 | A * | 8/1993 | Mattos | H03K 5/133 |
| | | | | 326/27 |
| 5,548,229 | A * | 8/1996 | Segawa | H03K 19/09429 |
| | | | | 326/57 |
| 5,592,104 | A * | 1/1997 | Bach | H03K 17/163 |
| | | | | 326/27 |
| 5,844,139 | A | 12/1998 | Miller et al. | |
| 5,880,606 | A * | 3/1999 | Griesbach | H03K 19/018585 |
| | | | | 326/49 |
| 5,900,758 | A * | 5/1999 | Kanno | G11C 7/1051 |
| | | | | 327/201 |
| 6,127,872 | A | 10/2000 | Kumata | |
| 6,181,165 | B1 * | 1/2001 | Hanson | B24B 9/065 |
| | | | | 326/81 |
| 6,184,753 | B1 | 2/2001 | Ishimi et al. | |
| 6,246,259 | B1 * | 6/2001 | Zaliznyak | H03K 19/018592 |
| | | | | 326/41 |
| 6,301,318 | B1 | 10/2001 | Wei et al. | |
| 6,313,663 | B1 * | 11/2001 | Mueller | B24B 9/065 |
| | | | | 326/58 |
| 7,394,424 | B1 | 7/2008 | Jelinek et al. | |
| 2002/0024880 | A1 | 2/2002 | Abedifard | |
| 2003/0052716 | A1 | 3/2003 | Kim et al. | |
| 2010/0090737 | A1 | 4/2010 | Watanabe et al. | |
| 2014/0241463 | A1 | 8/2014 | Leenaerts et al. | |

OTHER PUBLICATIONS

PCT Written Opinion, dated Oct. 9, 2017, in connection with International Application No. PCT/EP2017/051355, all pages.

Jiren Yuan et al., "New Single-Clock CMOS Latches and Flipflops with Improved Speed and Power Savings", IEEE Journal of Solid-State Circuits, vol. 32, No. 1, Jan. 1997, pp. 62-69.

Jiren Yuan et al., "High-Speed CMOS Circuit Technique", IEEE Journal of Solid-State Circuits, vol. 24, No. 1, Feb. 1989, pp. 62-70.

Sangjin Hong et al., "Variable-Rate Pipelined Multiplier Design for Reconfigurable DSP Applications", The 45th Midwest Symposium on Circuits and Systems, vol. 1, 2002, pp. I-587-I-590.

* cited by examiner

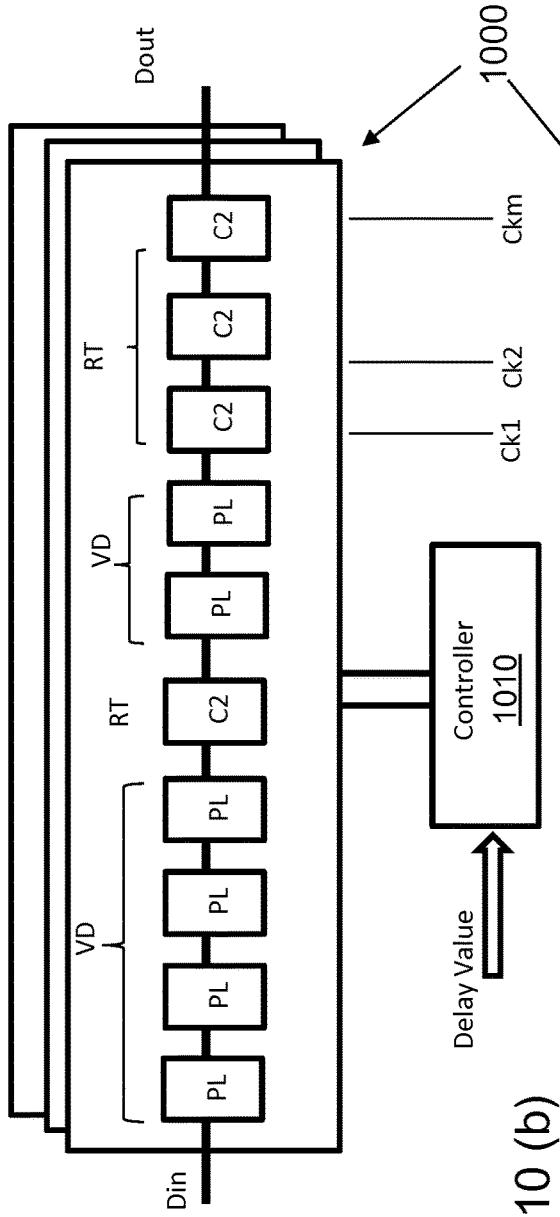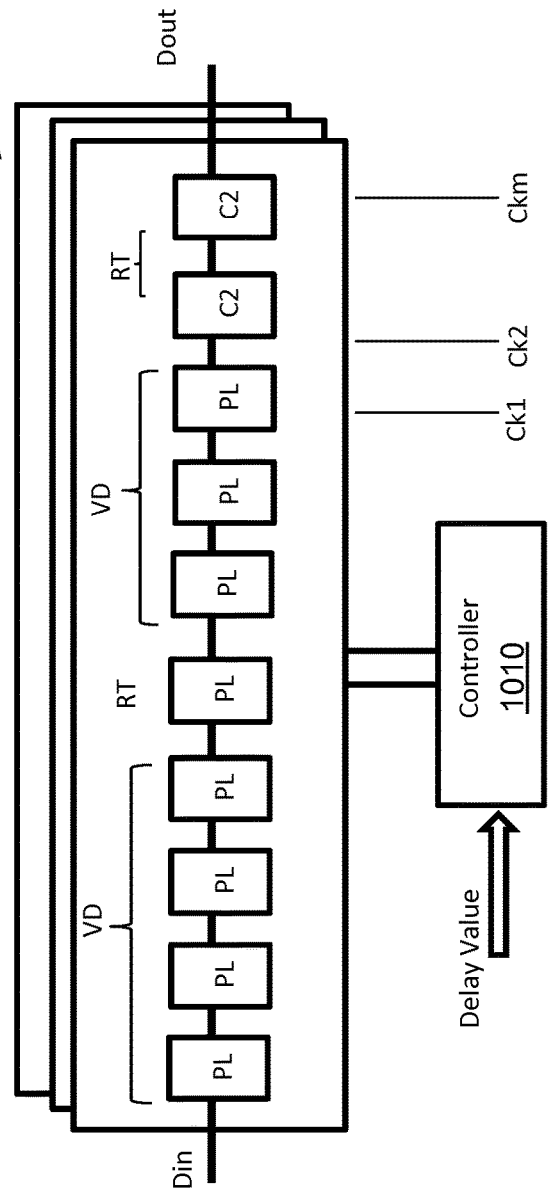
Fig. 10 (b)
Fig. 10 (c)

VARIABLE DELAY CIRCUITS

TECHNICAL FIELD

Embodiments herein relate to variable delay circuits. In particular, they relate to passable latch circuits and variable delay chains for delaying or time aligning data in an electronic device.

BACKGROUND

Variable delay circuits are used in a wide variety of electronic devices including wireless communication devices such as base stations and other network nodes, as well as portable devices such as smartphones and other user equipment. Variable delay circuits are generally digital logic circuits and they may also be found in computer and other processors.

In the fifth generation (5G) wireless communication systems, one of the challenging issues is the variable delay unit, which must be able to operate at very high speed, e.g. 2.5 Gb/s or higher. A variable delay unit is usually used to delay the time of a data or clock signal. The power consumption of the variable delay unit should also be as low as possible otherwise it will lead to issues of heat dissipation and short battery time. Further, the time delay should also be as accurate as possible otherwise the signal correlation could be reduced or lost.

One part of such a wireless communication system where variable delays are required is an antenna array system where signals are sent and received at differing time instants e.g. when forming a directional beam.

There are some options for implementing a variable delay unit. One option is using standard logics such as shift latches or D-type Flip Flops (DFFs) and multiplexer (MUX). Static logic DFFs have higher power consumption, and MUX which may be used to select one of the delayed version of data among all possible delays will have a limit on operating speed when signal frequency is high. Another option is to use a barrel shifter based on an address decoder. A barrel shifter is a digital circuit that can shift a data word by a specified number of cycles without the use of any sequential logic, only pure combinatorial logic. However, the barrel shifter speed is even slower than the standard logics. A further option is to use an analog delay line, but the analog delay line cannot deal with large delay range.

So far there are no good solutions which can meet the data delay requirements for 5G wireless communication systems.

SUMMARY

Therefore, it is an object of embodiments herein to provide a variable delay circuit with improved performance.

According to one aspect of embodiments herein, the object is achieved by a passable latch circuit. The passable latch circuit comprises a dynamic latch comprising a first P-transistor, a first N-transistor, a second P-transistor, a second N-transistor and a clock input circuitry. Sources of the first and second P-transistors are connected to a first voltage, and sources of the first and second N-transistors are connected to a second voltage. Further, gates of the first P-transistor and the first N-transistor are connected to a data input, and drains of the second P-transistor and the second N-transistor are connected to a data output. Furthermore, a drain of the first P-transistor is connected to a gate of the second P-transistor, and a drain of the first N-transistor is connected to a gate of the second N-transistor.

The clock input circuitry is connected between the gates of the second P-transistor and the second N-transistor such that a first node of the clock input circuitry is connected to the drain of the first P-transistor and the gate of the second P-transistor, a second node of the clock input circuitry is connected to the drain of the first N-transistor and the gate of the second N-transistor.

The passable latch circuit further comprises a control switch connected between the gates of the second P-transistor and the second N-transistor. The control switch has an on state and an off state, and the passable latch circuit is configured to have different delays by controlling the state of the switch.

According to one aspect of embodiments herein, the object is achieved by a variable delay chain comprising two or more passable latch circuits according to the embodiments described above.

The passable latch circuit according to the embodiments herein uses a dynamic latch with a pass control. The dynamic latch is a True Single Phase Clock Logic (TSPC) dynamic latch or so called "Split-output latch" which comprises only 5 transistors. This dynamic latch is considered as the most power efficient latch. By adding an additional control switch which may be implemented by a transistor, the latch function is controlled by the switch. If the switch is on, the latch function is no long existed but becomes a pure delay instead due to that the dynamic latch circuit turns into two equivalent inverters cascaded. When the switch is off, the passable latch circuit is the same as the normal "Split-output latch". A normal latch delays half clock cycle in retiming function. So the passable latch circuit 100 may be used as a delay unit or a retiming unit when the control switch is off to provide a latch delay or clocked delay or as a bypass unit when the control switch is on to have a pass delay. The pass delay is an intrinsic delay or propagation delay of the latch circuit. In this way, the passable latch circuit according to the embodiments herein may be configured to have different delays by controlling the state of the control switch, e.g. either be set as a bypass unit to have intrinsic delay or be set as a normal latch to have a half clock period delay.

A variable delay chain may be implemented by using many passable latch circuits as basic variable delay unit. A variation of the passable latch circuit may also be used as retiming unit. The variable delay chain built with such basic variable delay unit and the retiming unit has lower power consumption, higher speed, and less area comparing to the standard static logic. The implementation is also very simple and regular and the delay range is long, e.g. as long as several clock periods.

The passable latch circuit and the variable delay chain according to embodiments herein may be used in 5G wireless communication systems where digital beamforming is required in transceivers, and in a multiple-bit data path where multiple bits, e.g. 8 bits, are used. They may also be used in applications where data alignment is required, and the data rate is very high.

Thus, embodiments herein provide variable delay circuits with improved performance on e.g. power consumption, speed, delay range and area etc.

BRIEF DESCRIPTION OF THE DRAWINGS

Examples of embodiments herein are described in more detail with reference to attached drawings in which.

DETAILED DESCRIPTION

Figure 1:
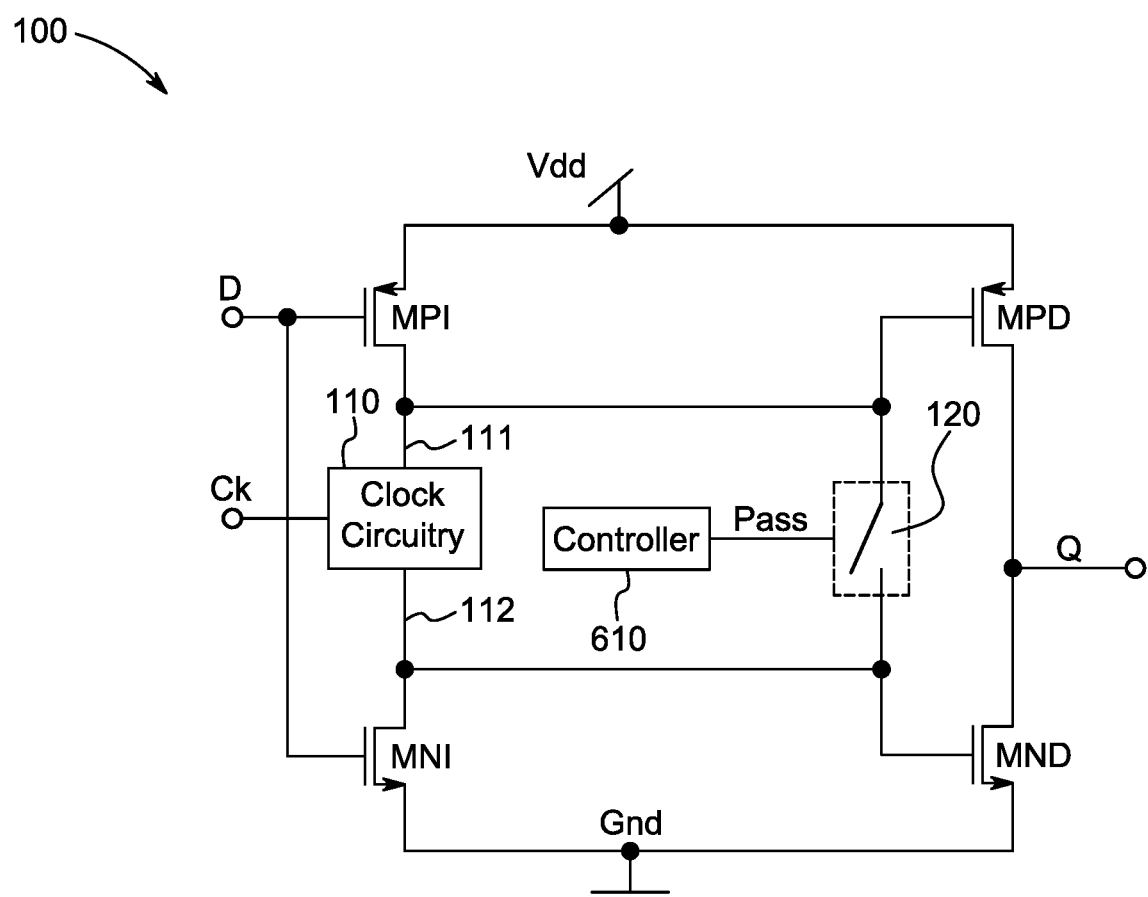
FIG. 1 is a general block view of a passable latch circuit according to embodiments herein.

A general schematic block view of a passable latch circuit 100 according to embodiments herein is shown in FIG. 1. The passable latch circuit (PL) 100 comprises a dynamic latch which comprises a first P-transistor MPI, a first N-transistor MNI, a second P-transistor MPD, a second N-transistor MND and a clock input circuitry 110.

As shown in FIG. 1, the transistors in the dynamic latch are connected in the following way:

sources of the first and second P-transistors MPI, MPD are connected to a first voltage e.g. a power supply Vdd;

sources of the first and second N-transistors MNI, MND are connected to a second voltage, e.g. a ground Gnd;

gates of the first P-transistor MPI and the first N-transistor MNI are connected to a data input D;

drains of the second P-transistor and the second N-transistor are connected to a data output Q;

a drain of the first P-transistor MPI is connected to a gate of the second P-transistor MPD; and a drain of the first N-transistor MN1 is connected to a gate of the second N-transistor MND.

Further, the clock input circuitry 110 is connected between the gates of the second P-transistor and the second N-transistor in the following way:

a first node 111 of the clock input circuitry 110 is connected to the drain of the first P-transistor MPI and the gate of the second P-transistor MPD, and a second node 112 of the clock input circuitry 110 is connected to the drain of the first N-transistor MNI and the gate of the second N-transistor MND.

The passable latch circuit 100 further comprises a control switch 120 connected between the gates of the second P-transistor MPD and the second N-transistor MND. The control switch 120 has an on state and an off state.

When the control switch is off, the passable latch circuit 100 is a normal dynamic latch, which is a True Single Phase Clock Latch (TSPC) or so called a "Split-output latch". This dynamic latch is considered as the most power efficient latch. By adding an additional control switch 120, the latch function may be controlled by a control signal PASS. If the control signal PASS turns on the control switch 120, then the latch function no longer exists but becomes a pure delay instead. This is due to that the passable latch circuit 100 turns into two cascaded equivalent inverters, where the first P-transistor and N-transistor forms a first inverter and the second P-transistor and N-transistor forms a second inverter. When the control signal PASS turns off the control switch, the passable latch circuit 100 is the same as the "Split-output latch" and has normal latch function. A normal latch delays input data half clock cycle in retiming function. So, the passable latch circuit 100 may be used as a delay unit or a retiming unit when the control switch is off to provide a latch delay or clocked delay or as a bypass unit when the control switch is on to have a pass delay. The pass delay is an intrinsic delay or propagation delay of the latch circuit.

Therefore, according to embodiments herein, the passable latch circuit 100 may be configured to have different delays by controlling the state of the control switch 120.

The passable latch circuit shown in FIG. 1 may be configured as a single phase retiming unit, where only one clock signal Ck is used.

Figure 2:
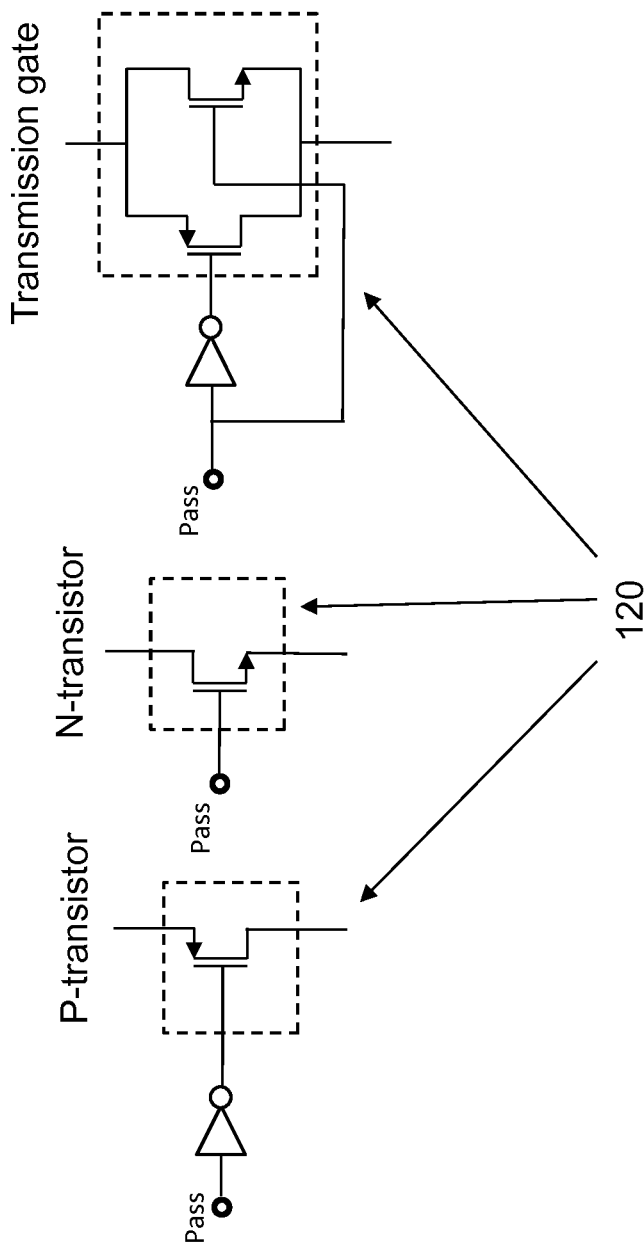
FIG. 2 is a schematic block view illustrating example implementations of the control switch in the passable latch circuit according to embodiments herein.

According to some embodiments herein, the control switch 120 may be implemented by an N-transistor, a P-transistor or a transmission gate comprising an N-transistor and a P-transistor connected in parallel, as shown in FIG. 2.

Figure 3:
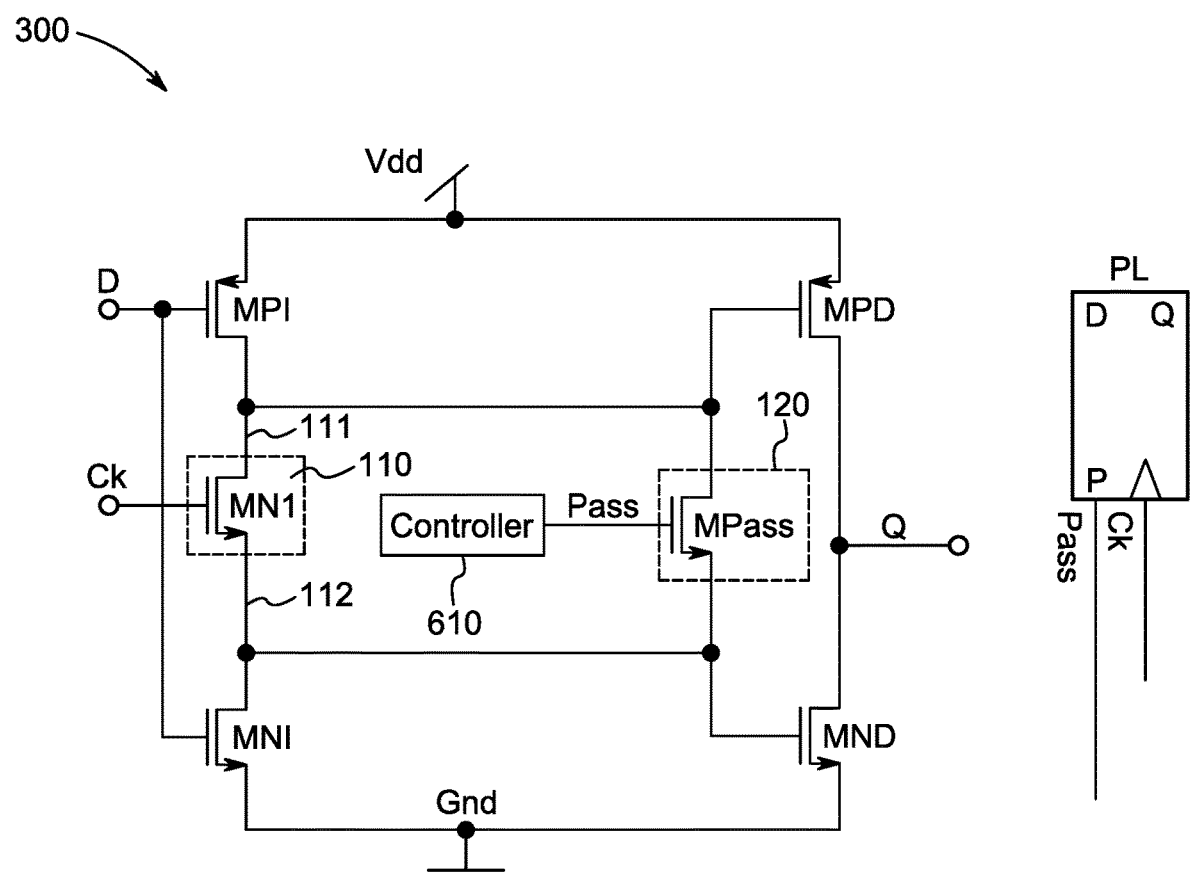
FIG. 3 is a schematic block view illustrating a first example embodiment of the passable latch circuit according to embodiments herein.

According to some embodiments, the clock input circuitry 110 may comprise an N-transistor. FIG. 3 shows an example embodiment of the passable latch circuit 100, wherein the clock input circuitry 110 comprises an N-transistor MN1. A drain of the N-transistor MN1 is connected to the first node 111 of the clock input circuitry 110, a source of the N-transistor MN1 is connected to the second node 112 of the clock input circuitry 120 and a gate of the N-transistor MN1 is connected to a clock input Ck. In this embodiment, the control switch 120 is implemented by an N-transistor MPass. The control switch 120 may also be implemented by a P-transistor or a transmission gate as discussed above. The dynamic latch with N-transistor in the clock input circuitry 110 is an N-dynamic latch. In order to simplify the connections of circuits built by the passable latch circuit 100, a symbol of the passable latch circuit, denoted as PL, with input/output and control terminals is shown to the right in FIG. 3.

Alternatively, the clock input circuitry 110 may comprise a P-transistor (not shown), a source of the P-transistor is connected to the first node 111 of the clock input circuitry 110, a drain of the P-transistor is connected to the second node 112 of the clock input circuitry 110 and a gate of the P-transistor is connected to a clock input Ck. The dynamic latch with P-transistor in the clock input circuitry 110 is a P-dynamic latch.

Figure 4:
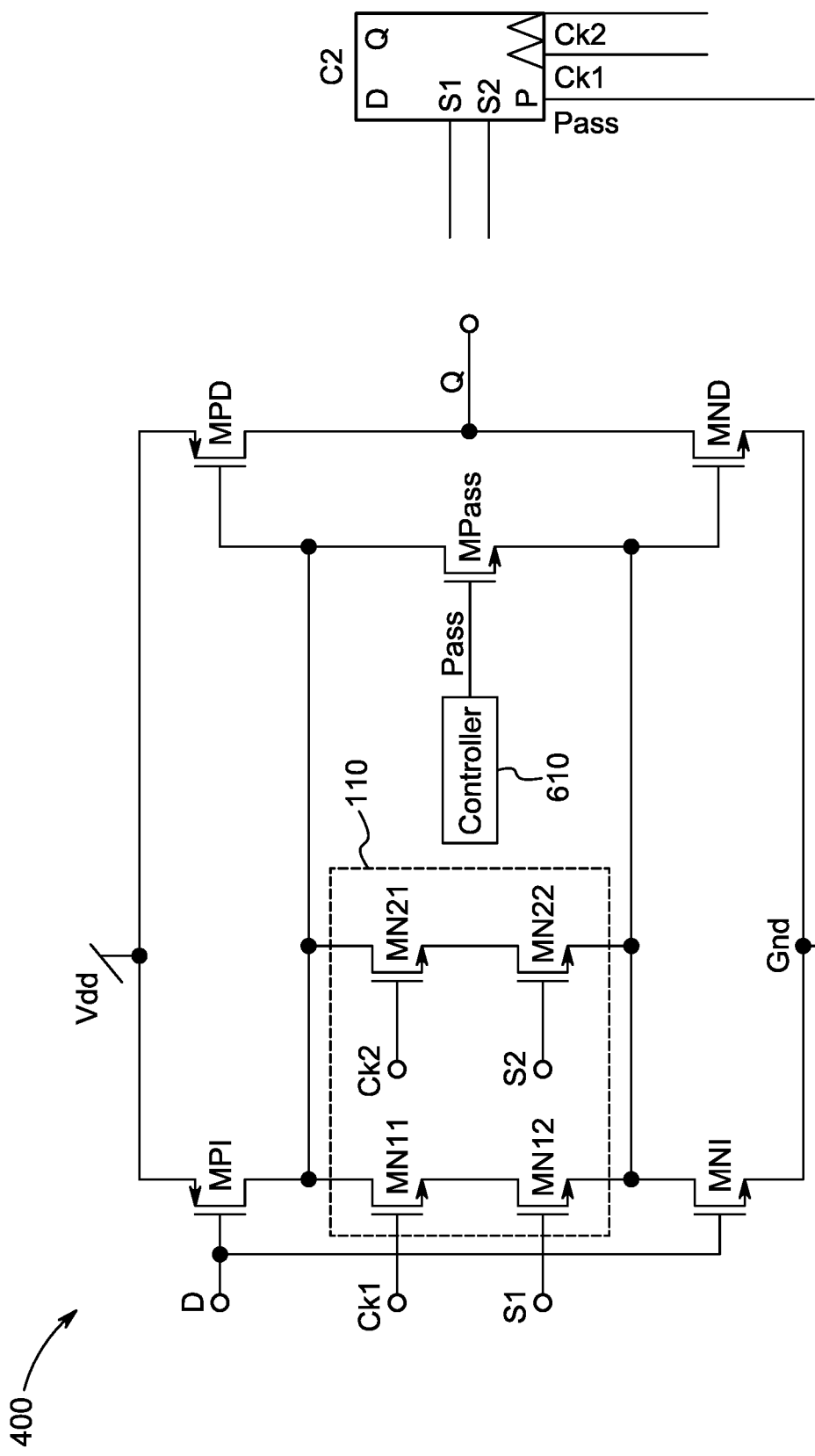
FIG. 4 is a schematic diagram illustrating a second example embodiment of the passable latch circuit according to embodiments herein.

According to some embodiments, the clock input circuitry 110 may comprise two clock input branches, as shown in FIG. 4. Each clock input branch comprises a first N-transistor MN11, MN21 and a second N transistor MN12, MN22 connected in series between the first and second nodes 111, 112 of the clock input circuitry 110.

A gate of the first N-transistor MN11, MN21 is connected to a respective clock signal Ck1, Ck2 input terminals and a gate of the second N-transistor MN12, MN22 is connected to a respective control signal S1, S2 input terminals.

The passable latch circuit shown in FIG. 4 may be configured to be a two-phase retiming unit, denoted as 400, by controlling the two clock input branches and the state of the control switch MPass. Two opposite clock phase signals Ck1, Ck2 may be applied on the clock signal input terminals, and controlled by the respective control signals S1 and S2. The clock signals Ck1 and Ck2 only take effect when the clock and control input terminals are both logic high. The passable control PASS has the same function as in the passable latch circuit 100, 300 shown in FIGS. 1 and 3, meaning that the two-phase retiming unit 400 can also be by-passed. In order to simplify the connections of circuits built by the two-phase retiming unit 400, a symbol of the two-phase retiming unit 400, denoted as C2, with input/output and control terminals is shown to the right in FIG. 4.

Figure 5:
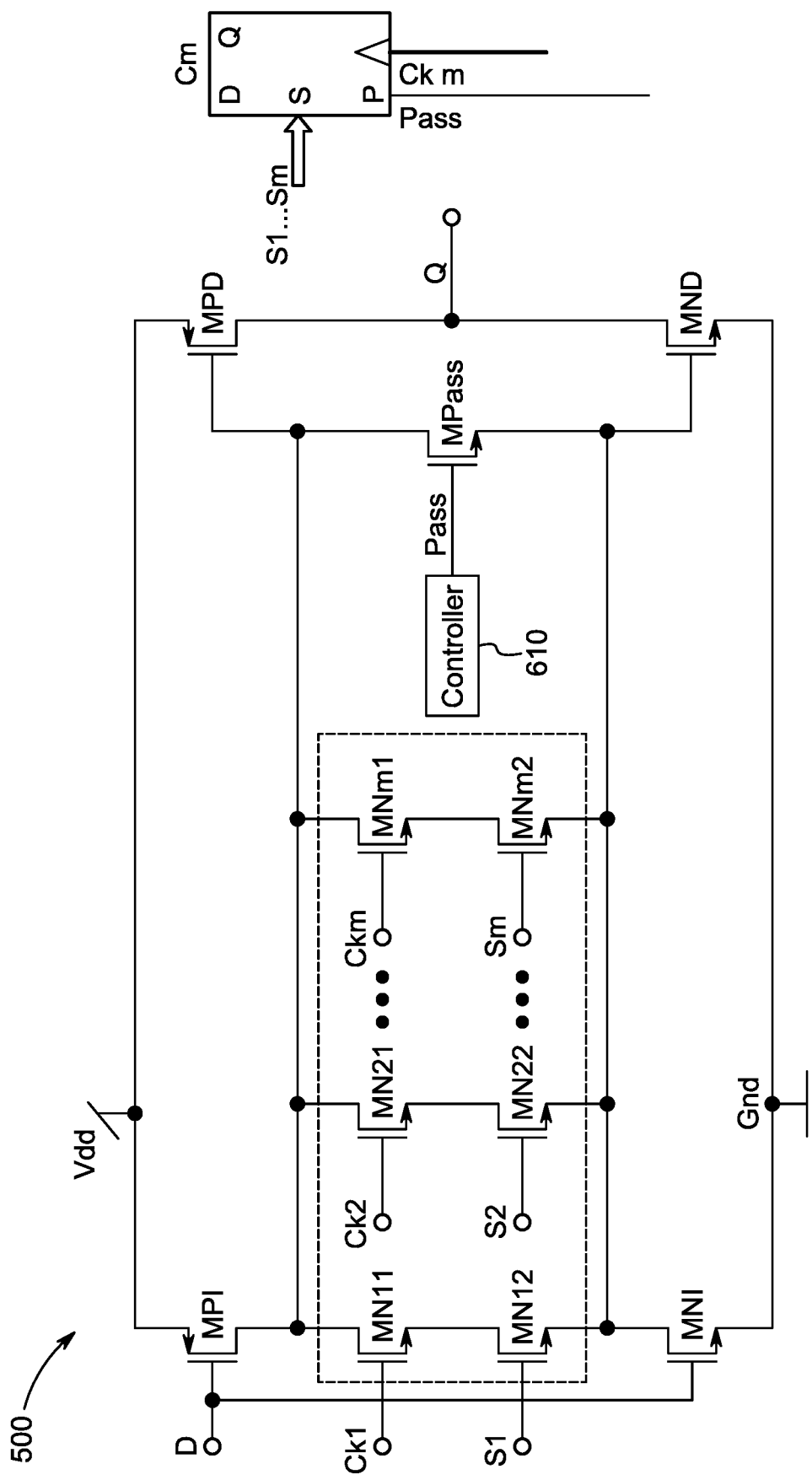
FIG. 5 is a schematic diagram illustrating a third example embodiment of the passable latch circuit according to embodiments herein.

According to some embodiments, the clock input circuitry 110 may comprise a plurality of M clock input branches, as shown in FIG. 5. Each clock input branch comprises a first N-transistor MN11, MN21 . . . MNm1 and a second N-transistor MN12, MN22, MNm2 connected in series between the first and second nodes of the clock input circuitry 110.

A gate of the first N-transistor MN11, MN21, . . . MNm1 is connected to a respective clock signal Ck1, Ck2, . . . Ckm input terminals and a gate of the second N-transistor MN12, MN22, . . . MNm2 is connected to a respective control signal S1, S2, . . . Sm input terminals.

The passable latch circuit shown in FIG. 5 may be configured to be a multiple M-phase retiming unit, denoted as 500, by controlling the M clock input branches and the state of the control switch MPass. Except that the M-phase retiming unit 500 has more clock input terminals and control terminals, it works similarly to the PL 100, 300 and two-phase retiming unit C2 400. When multiple phase clocks are appeared at the clock input terminals, and proper control signals are set at the S1, S2, . . . Sm input terminals, one may get a required delay among the M possible phases to achieve a fine delay retiming function.

In order to simplify the connections of circuits built by the M-phase retiming unit 500, a symbol of the M-phase retiming unit 500, denoted as Cm, with input/output and control terminals is shown to the right in FIG. 5.

A single phase retiming unit, e.g. PL 100, 300, consumes the least power in operation comparing to C2 and Cm units 400, 500. The passable latch circuits may be built with Complementary Metal Oxide Semiconductor (CMOS) transistors. As circuit speed improves as the CMOS technology develops, the PL 100, 300, 400, 500 according to embodiments herein may reach very high speed for latch operation.

As discussed above, the passable latch circuit 100, 300, 400, 500 according to embodiments herein comprises a dynamic latch which latches data for a short time, e.g. a clock period. If the data needs to be kept or stored for a longer time, the passable latch circuit 100, 300, 400, 500 may comprise a logic holding circuit (not shown), so the dynamic latch becomes a static one.

All of the passable latch circuits 100, 300, 400, 500 described above with relation to FIGS. 1-5 may be used as a bypass unit to provide an intrinsic delay or propagation delay when the control switch 120 is on, or as a retiming unit to provide a clocked delay or latch delay when the control switch 120 is off. The passable latch circuits 100, 300, 400, 500 may be combined into a chain comprising multiple passable latch circuits or bypass/retiming units. The chain may be controlled using a controller which sets the control switch 120 in each unit.

The delay obtained using a chain will depend on the state of the control switch in each unit and the applied and/or selected clock for each unit.

Figure 6:
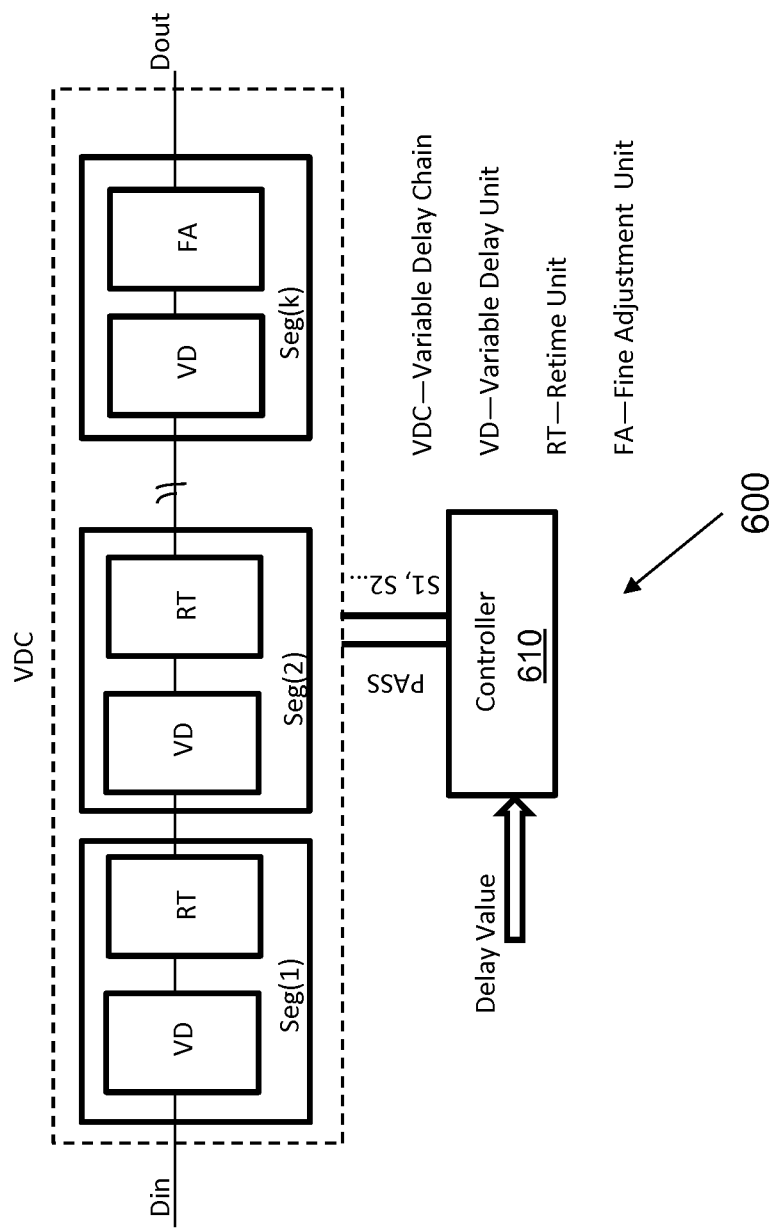
FIG. 6 is a general block view illustrating a variable delay chain according to embodiments herein.

A variable delay chain may be divided into one or more segments. FIG. 6 shows a top view of a variable delay chain VDC 600 comprising one or more segments Seg(1), Seg(2) . . . Seg(k). Each segment may comprise at least one variable delay unit VD and at least one retiming unit RT after the VD, and in each segment, except for the last one, the last stage must be a retiming unit. In the last segment Seg (k), RT may be replaced by a fine adjustment unit FA.

The VD may be implemented by the passable latch circuit 100, 300, two-phase and/or M-phase retiming unit 400, 500 according to embodiments described above in FIGS. 1-5.

The retiming unit RT may e.g. be a passable latch circuit shown in FIGS. 1-5 but it should be configured such that the control switch 120 is switched off. Alternatively, the RT may be an equivalent circuit without the control switch 120 which would always provide a latch delay or a clocked delay, i.e. the last retiming unit of each segment is configured to provide a clocked delay.

A VD unit may be configured as a variable delay unit or re-configured as a combination of variable delay units separated by retiming units.

For instance, a VD may comprise 10 passable latch circuit 100, 300 in serial. The VD may be configured as a variable delay unit by configuring 9 of the passable latch circuits 100, 300 as bypass but not the last one. This VD may be re-configured as 2 VDs separated by a retiming unit, where each VD have 5 passable latch circuits 100, 300 in serial, 4 of them may be configured as bypass but not the 5th and 10th of the passable latch circuits 100, 300. The 5th and 10th of the passable latch circuits 100, 300 may be used as the retiming unit.

The variable delay chain VDC 600 further comprises a controller 610 which is used as a delay control generator, configured to generate delay control signals PASS for controlling the variable delay chain 600 by controlling the state of the control switches in the passable latch circuits 100, 300 and/or M-phase retiming units 400, 500. The controller 610 may be further configured to select a clock input branch by controlling the states of the control signal inputs S1, S2 . . . Sm in the multiple M-phase retiming units 400, 500.

In other words, the variable delay chain 600 may be controlled by a digital vector Delay Value as shown in FIG. 6. Based on this Delay Value, the controller 610 creates a control word PASS, and may also generate clock control signals S1, S2 . . . Sm if multiple M-phase retiming units 400. 500 are used, and control the VDC 600 to reach the desired delay.

Figure 7:
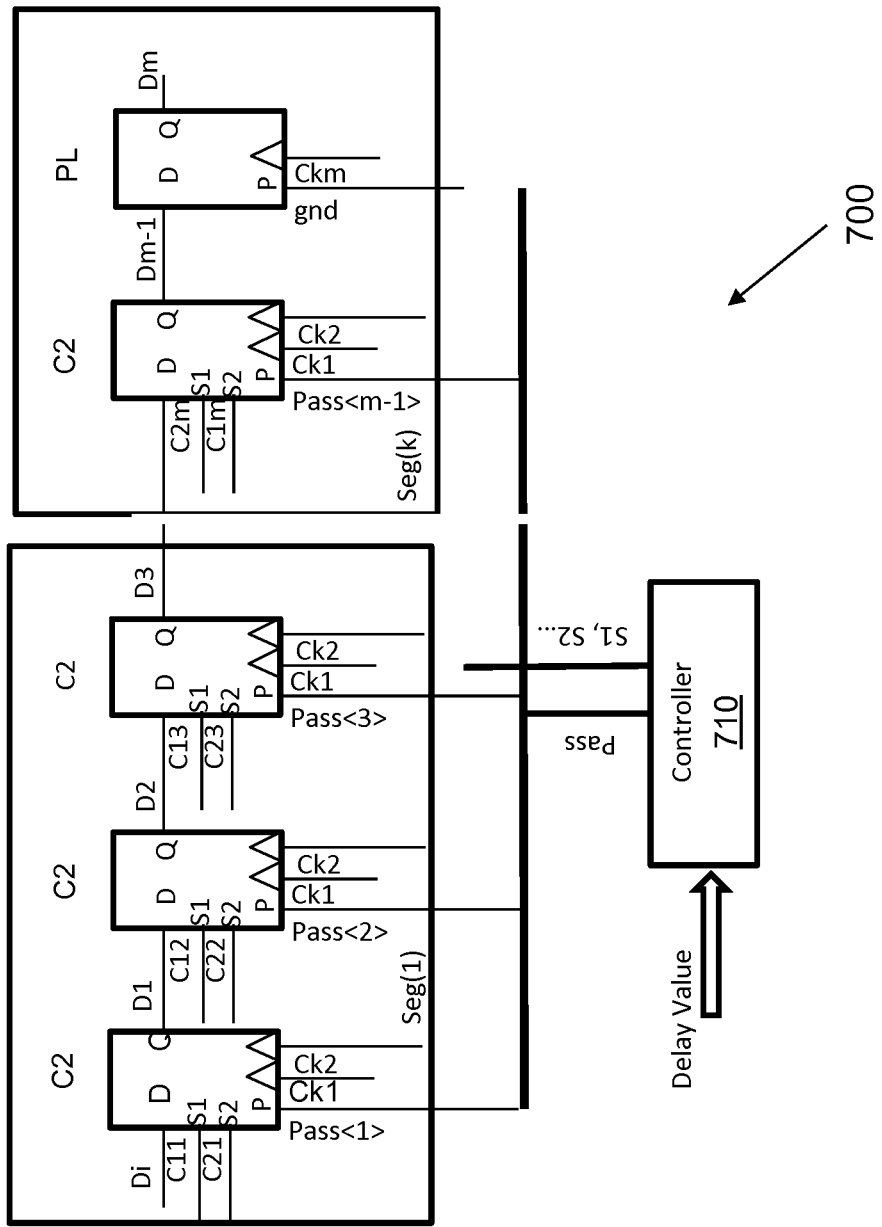
FIG. 7 is a block view illustrating one example of a variable delay chain according to embodiments herein.

According to some embodiments, the first segment may comprise one or more two-phase retiming units C2 400, and the last segment may comprise a two-phase retiming unit C2 400 and a passable latch circuit PL 100, 300. FIG. 7 shows an example of a multiple segment VDC 700 formed by the passable latch PL 100, 300 shown in FIGS. 1 and 3 and the two-phase retiming unit C2 400 shown in FIG. 4. As shown in FIG. 7, all VD units are built with two-phase retiming unit C2 400, except that the last one which is a PL 100, 300 and triggered by Ckm to get accurate delay, where Ckm is the m-th clock signal with a delay at desired accuracy.

According to some embodiments, the first segment may comprise one or more passable latch circuits PLs 100, 300 and a two-phase retiming unit C2 400, and the last segment may comprise one or more M-phase retiming units Cm 500.

Figure 8:
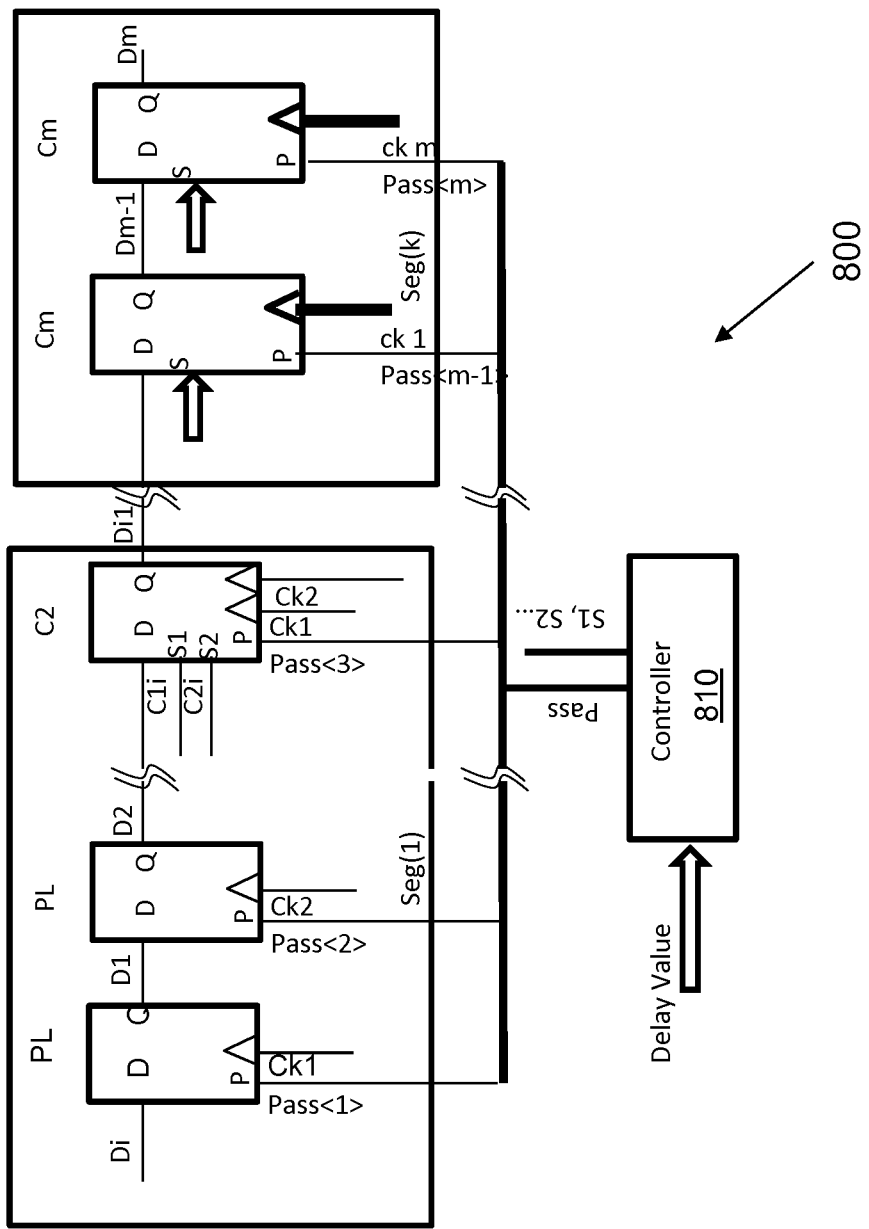
FIG. 8 is a block view illustrating another example of a variable delay chain according to embodiments herein.

FIG. 8 shows an example embodiment of a multiple segment VDC 800. In this example, all main delay latches are built with the passable latch PL 100, 300 shown in FIGS. 1 and 3. In the last segment, the last retiming unit is a fine delay unit built with a multiple-phase retiming unit Cm 500 shown in FIG. 5. Of course the last retiming unit may be built with C2 400 or PL 100, 300, but triggered by Ckm.

One design option is that the PLs are configured to be triggered by Ck1 and Ck2 along the delay chain in an interleaved manner, as shown in FIG. 8.

In general, according to embodiments herein, a VDC may be built with different options, chosen among the basic delay circuits PL 100, 300, C2 400, and Cm 500 described above. Inserting one latch operating at an opposite clock phase to a clock applied in a preceding latch, with a clock period Tp will delay data signal a half clock period Tp/2 if a timing criteria is met, which will be discussed in the following. Two latches operating at opposite clock phases can form a flip-flop function, and delay the data one clock period Tp.

Inserting one latch operating at the same clock phase to a clock applied in a preceding latch, with a clock period Tp will delay data signal a full clock period Tp if a timing criteria is met, which will be described in the following.

If a very long variable delay time is required, for instance the total delay time is reaching 100 clock periods, then the VDC must be cut into several segments, Seg(i), i=1, 2, . . . , k, each comprise a VD and a RT. Each segment can be re-configured as multiple VDs separated by RTs, and ended with an RT stage. But for a short variable delay one segment may be enough.

In the following, variable time delay of a VDC will be discussed.

In general, the delay of a VDC is $$\text{Delay} = td_{fine} + \sum_i \text{Delay}(Seg(i)) \quad (1)$$

Where $td_{fine}$ is a delay from the fine adjustment unit. The delay range is defined as the time from the minimum delay to the maximum delay.

In the following, the delay from a segment is discussed. As described earlier, a segment may comprise a VD followed by an RT. The VD may comprise one or more PLs, as shown in FIG. 8, in Seg (1). When the PL delay units or retiming units use N-dynamic latch based circuits, data is transparent at the output when the clock terminal is logic high.

For keeping timing correctly, there are should be allowed upper and lower limits of intrinsic delay for a PL. Assume tdp_max and tdp_min are the maximum and the minimum intrinsic time delay allowed for a PL, respectively, between two retiming units triggered by two clock phases. Also assume that the incoming data is triggered with the second clock rising edge Ck2.

For a first case, i.e. when the incoming data is triggered with the second clock rising edge Ck2 and the first clock Ck1 rising edge is used in the retiming unit. Assume that ni stages of PL latches are set as in a bypass state, i.e. each PL has a delay of tdp, where ni is an odd number. When the ni latches are set as passable, they have delay D1=ni·tdp. For keeping the output data in the correct time, the edge of the output of the delayed data is retimed by the first clock Ck1, the following timing criteria is sufficient condition for correct timing:

$$\max(D1) = ni \cdot tdp\_\max < 0.5 \cdot Tp \quad (2)$$

In such a delay segment, Seg(i), the minimum delay is a half clock period, i.e. Delay(i)_min(i)=0.5·Tp, and the maximum delay is ni times the half clock period, that is Delay_max(i)=0.5·ni·Tp. As such the delay segment may be implemented only using the PL 100, 300, which gives minimum power consumption. Then the delay of the segment Seg(i) is $$\text{Delay}(i) = \frac{ni(C(i)) \cdot Tp}{2}, \quad (3)$$

where $0 < ni(C(i)) \leq ni$

C(i) is a control word for the delay segment Seg(i).

For a second case, i.e. when the incoming data is triggered with the second clock rising edge Ck2 and the same rising edge of the second clock Ck2 is used in the retiming unit. When the ni latches are set as passable, they have delay D2=ni·tdp. For keeping the output data in the correct time, the edge of the delayed output data is retimed by the second clock Ck2. The following timing criteria are sufficient condition for correct timing:

$$\max(D2) = ni \cdot tdp\_\max < Tp$$

$$\min(D2) = ni \cdot tdp\_\min > Tw \quad (4)$$

Where Tw is the clock pulse width and Tw is typically less than Tp/2. In such a delay segment, the minimum delay is one clock period, and the maximum delay is ni times half clock period. Where ni is an even number.

Comparing Eq. (4) with Eq. (2), using the same clock edge in the retiming unit as the clock edge triggering incoming data could allow twice of delay units, i.e. PLs, used in one segments as in the first case, thus increases the delay time. But the minimum delay is also twice of that for the first case.

The same clock phase may only be asserted after the data signal has passed though sufficient PLs configured as bypass to provide the minimum intrinsic delay of Tw or Tp/2.

In case that the delay provided by the PL chain is too short i.e. is less than half of Tp, an opposite clock should be asserted.

There are many variations when building a delay segment. For example, all PLs in FIG. 8 may be replaced by C2. This is shown in FIG. 7.

In this way, one could implement any delay, i.e. $td = \frac{n \cdot Tp}{2}$, where n is an integer, and n>1.

Figure 9:
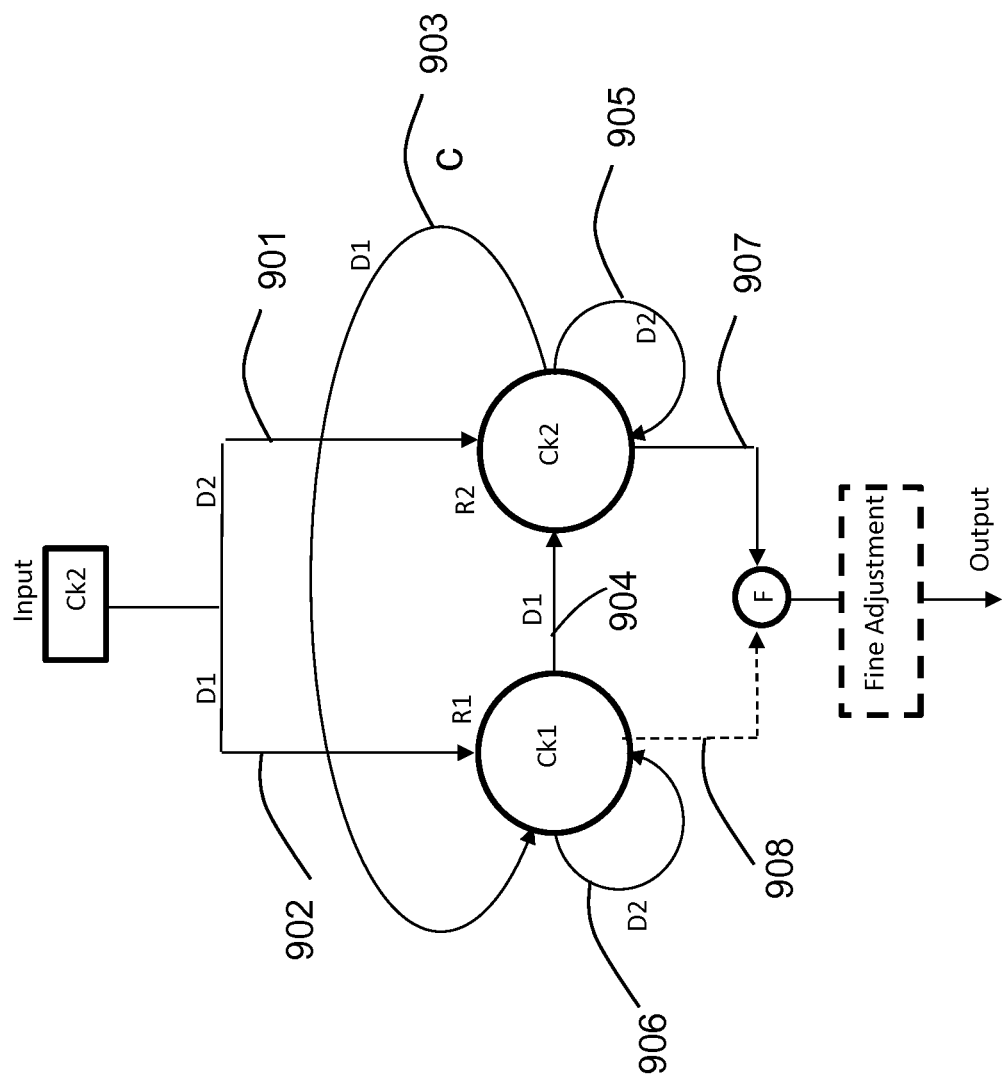
FIG. 9 is a diagram illustrating delay scheme for a variable delay chain according to embodiments herein.

The functions and different delays of the VDC may be further illustrated by a delay scheme shown in FIG. 9. In FIG. 9, the input data shown on the top of the figure is triggered by Ck2 and the output data is shown at the bottom of the figure. Two cycles, R1 and R2, shown in the middle of the figure, represent the retiming units, and the texts Ck1, Ck2 inside the cycles indicate which clock rising edge is used for latching the retiming units. The multiple paths denoted by numbers 901-908 with different delay times D1 and D2 represent varies delay paths possible from the input node to the output node to achieve different delay time. For example, the paths 901→R2→907 and 901→R2→903→R1→904→R2→907 have different delay time.

For a segment but not the last one, the output can always come from R2, i.e. from a retiming unit triggered by the second clock edge. This is shown by the solid path lines e.g.

901→R2→907, or 901→R2→903→R1→904→R2→907, or 901→R2→905→R2→907, from the input node to the output node.

For the last segment, the output may come from either R1 or R2 and pass the Fine Adjust unit F. This is shown in either solid path line, e.g. 907 or dashed path line, e.g. 908.

When the path goes through D1 one time, it will contribute 1 unit delay, and when it goes though D2 one time, it will contribute 2 unit delay. Total delay is the sum of all contributions as the path goes through from the input node to the output node, excluding the fine delay adjust in the fine adjustment, which is less than half of clock period. Note that one unit delay is half of clock period and two unit delay is one clock period.

So for a segment, but not the last one, the delay is:

$$\text{Delay}(i) = \sum_{k=1}^{Ni1} \frac{Tp}{2} + \sum_{k=1}^{Ni2} Tp \qquad (5)$$

Where Ni1 is the number of paths go through D1 and Ni2 is the number of paths go through D2.

And for the VDC, the delay is $$Delay_{vdc} = td_{fine} + \sum_{j=1}^{k} Delay(k) \qquad (6)$$

Where $td_{fine}$ is the delay from the fine adjustment unit and k is the number of segments in the VDC.

With the delay scheme shown in FIG. 9, It is easy to see if the output comes from R1 or R2 and finally to node F. If the output comes from R2 and finally to node F, the data is delayed by N times of the clock period, where N is an integer. If the output comes from R1 and finally to node F, the data is delayed by (2N+1)/2 times of the clock period. This may be used as design rules to make the circuit function properly, i.e, the delay is correct and logic is correct.

Figure 10:
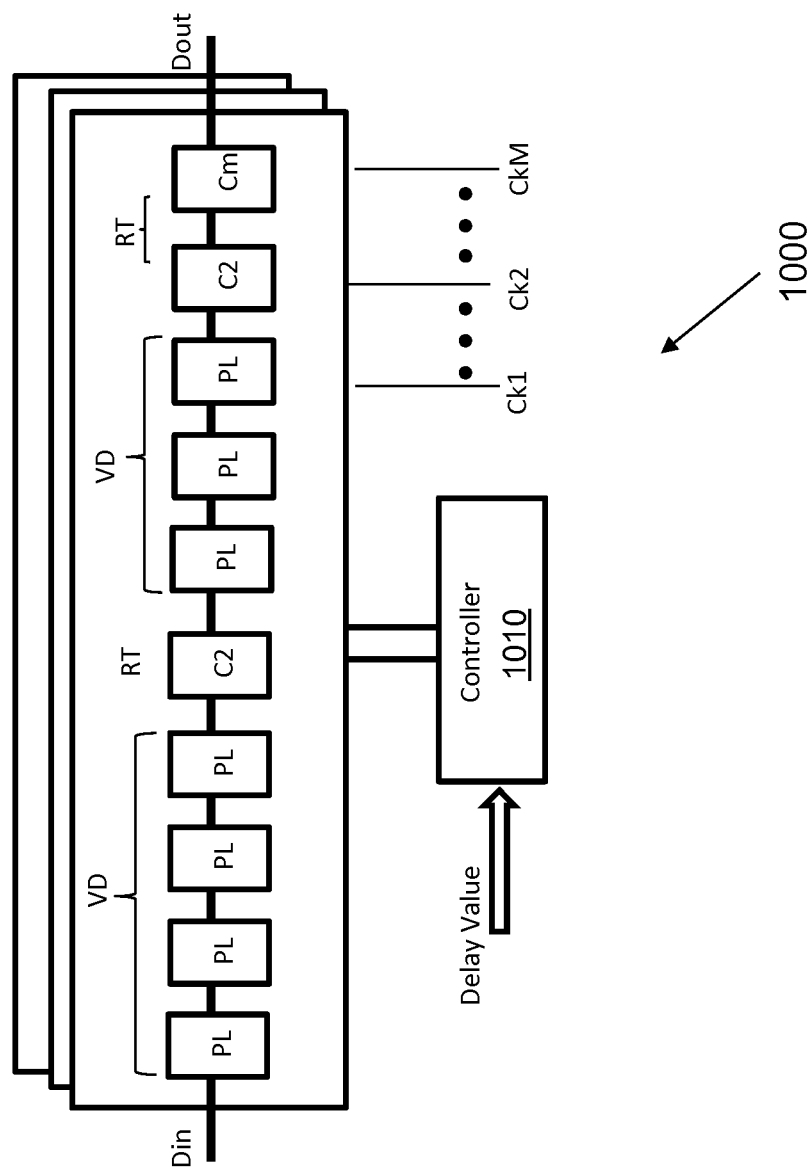
FIG. 10 (a) (b) (c) are block views illustrating example implementations of multiple-bit delay paths according to embodiments herein.

According to some embodiments, a multiple-bit data delay path may be built which comprises a plurality of variable delay chains VDCs. Each variable delay chain VDC may be configured to delay one bit of the multiple-bit data. FIG. 10(*a*) (*b*) (*c*) show three examples of multiple-bit data delay path. In FIG. 10(*a*), the VDC, for instances, comprises two segments each comprises a VD and an RT. In the first segment, the VD comprises a plurality of PLs, e.g. 4 PLs and the RT comprises a two-phase retiming unit C2. In the second segment, the VD also comprises a plurality of PLs, 3 PLs and the RT comprises a two-phase retiming unit C2 and an M-phase retiming unit Cm.

Multiple phase clocks CK={Ck1, . . . , Ck2, . . . , CkM} are needed for the VDC shown in FIG. 10(*a*), where Ck1 and Ck2 are two-phase non-overlapping clocks among the M-phase clocks. A required phase Ckm is created among the M-phase clocks, and used in the last stage for fine delay adjustment according to the required time delay Td:

$$Td = j \cdot Tp + t_{dk} \qquad (7)$$

and $$\frac{k \cdot Tp}{M} \le t_{dk} \le \frac{(k+1) \cdot Tp}{M}$$

Where Tp is clock period, and k=0, 1, . . . , M−1. $t_{dk}$ is delay difference between two successive clocks, and j is the number of period of the VDC delays.

In FIG. 10(*b*), the retiming unit RT in the second segment is built with three 2-phase retiming units C2 400. Then the VDC only needs 3 clock phases, that is two-phase clocks Ck1 and Ck2, and an additional fine delayed clock phase Ckm, to delay the data according to a required delay at a required accuracy.

In FIG. 10(*c*), the retiming unit RT in the first segment is built with a PL 100, 300 and the retiming unit RT in the second segment is built with two 2-phase retiming units C2 400. If timing error can be avoided between VDs, the C2 400 may be replaced by a PL100, 300 and make circuit simple.

In general, for implementing a fine delay tuning or adjustment in the last stage, at least three latches may be needed, for example in FIG. 10(*b*). Two of them deliver required delay at an accuracy of half clock period, and the last one creates an extra delay which is less than half of clock period, at the required accuracy.

The fine delay adjustment may be implemented in many other ways. One way is to delay the data by an analog variable delay circuit. The other alternative is to delay the clock rather than the data itself, and use the accurate delayed clock to trigger the data by latches implemented by, e.g. the passable latch circuit PL 100, 300, two- or M-phase retiming unit C2 400, Cm 500.

Therefore, according to some embodiments, the fine delay adjustment unit may be implemented by any one of the passable latch circuit 100, 300, two-phase or M-phase retiming unit 400, 500. Then the fine delay adjustment is realized by delaying the clock signal used to trigger the data in the fine adjustment unit.

Figure 11:
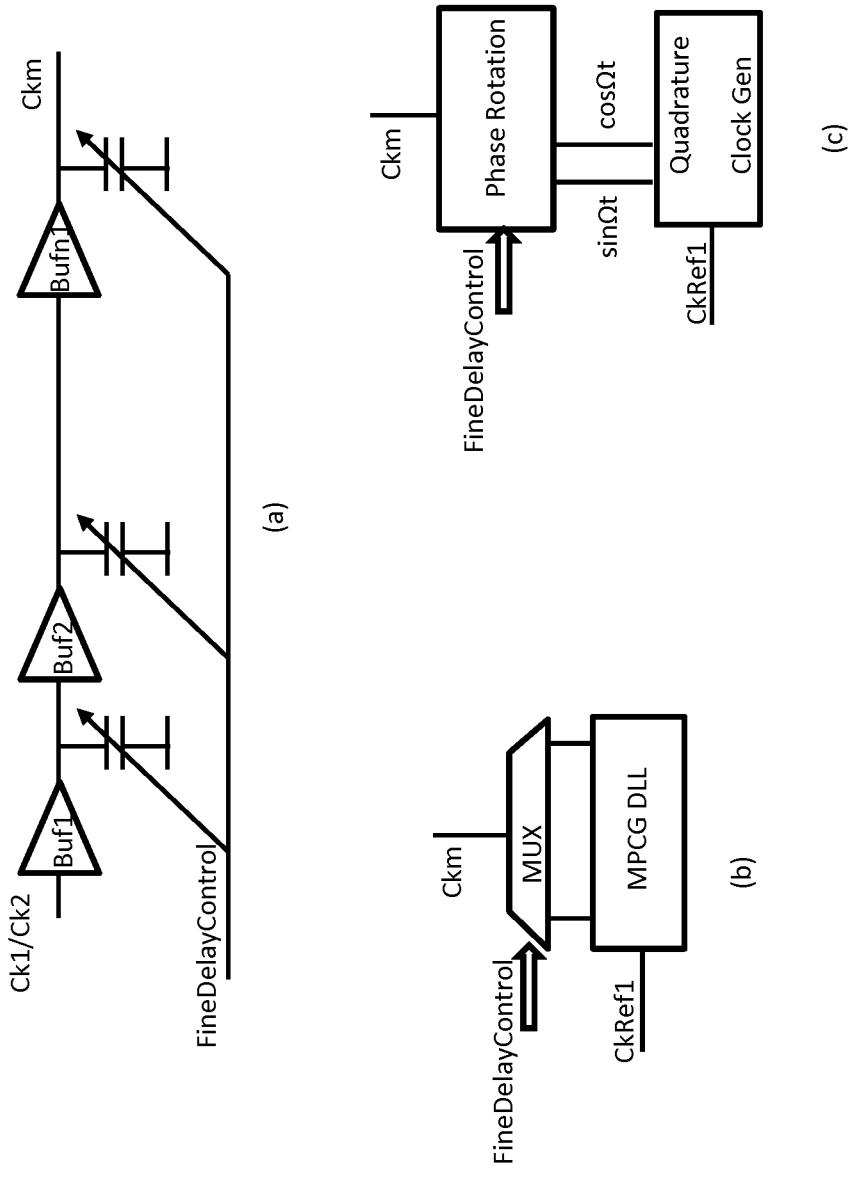
FIG. 11 (a) (b) (c) are example embodiments for creating clock phases for fine delay adjustment unit.

The ways to generate the required clock edge for fine delay adjustment are shown in FIG. 11, where (a) is via variable capacitance connected to the output of delay buffers, while (b) is via a multiple phase clock generator implemented by, for instance a Digital Logic Latch (DLL), and a MUX to select the desired clock phase; and (c) is a quadrature clock generator, which first creates quadrature clocks, and then via a phase rotation circuit to interpolate the desired clock phase.

To summarise the discussions above, advantages of various embodiments of the passable latch circuit PL 100, 300, two- or M-phase retiming unit C2 400, Cm 500 and variable delay chain VDC 600 include:

The passable latch circuit 100, 300 is power efficient and can operate at high speed.

The variable delay chain 600, 700, 800 implemented by the passable latch circuit 100, 300 and the two-phase or M-phase retiming unit 400, 500 has lower power consumption, higher speed, and less area comparing to the prior art solution built with the standard static logic. The implementation is also very simple and regular and the delay range is long, e.g. as long as several clock periods.

The passable latch circuit 100, 300, 400, 500 and the variable delay chain 600, 700, 800 according to embodiments herein may be used in 5G wireless communication systems where digital beamforming is required in transceivers, and in a multiple-bit data path where the bit-width is at least 8 bits. They may also be used in applications where data alignment is required, and the data rate is very high.

Figure 12:
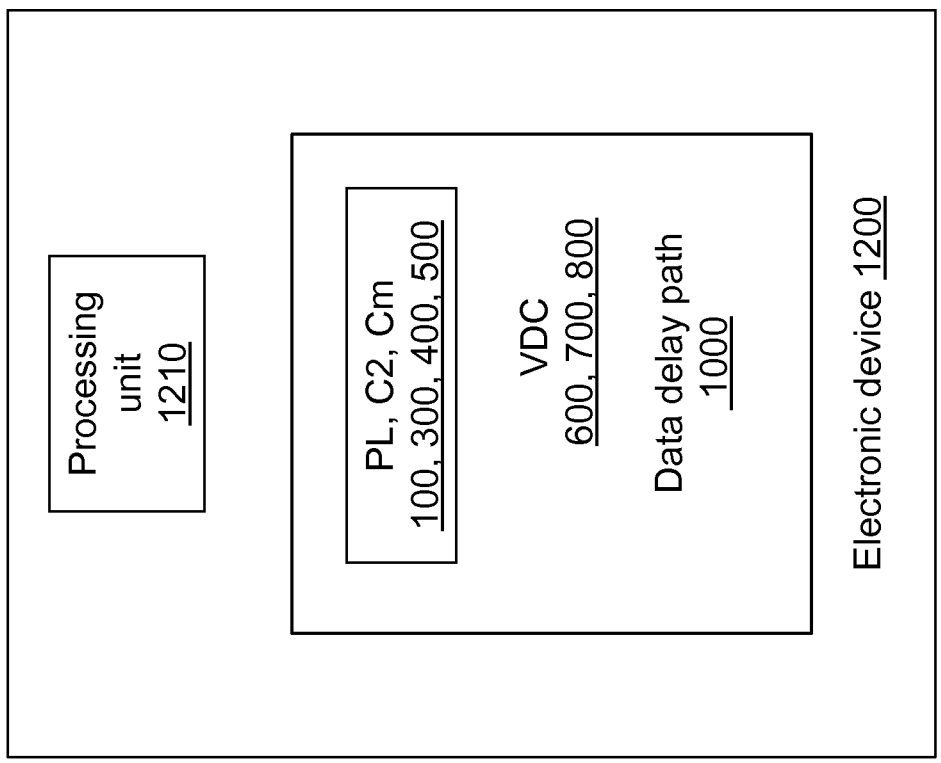
FIG. 12 is a block diagram illustrating an electronic device in which embodiments herein may be implemented.

The passable latch circuit PL 100, 300, two- or M-phase retiming unit C2 400, Cm 500 and the variable delay chain VDC 600, 700, 800, the multiple-bit data delay path 1000 according to the embodiments herein may be employed in digital logic circuits or various electronic devices. FIG. 12 shows a block diagram for an electronic device 1200. The electronic device 1200 may be a receiver, a transmitter, a transceiver, a wireless communication device, such as a user equipment or a mobile device and/or a base station, a multi-antenna systems in a radio base station, or any general electronic circuit or equipment, such as computers, processors etc. which use digital logic circuits and need variable delay circuits. The electronic device 1200 may comprise other units, where a processing unit 1210 is shown, which may interact with the delay control generator 610, 710, 810 in the variable delay chain VDC 600, 700, 800 and the multiple-bit data delay path 1000 for different delay settings.

Those skilled in the art will understand that although N-transistor, P-transistor and control switch transistor as shown in FIGS. 1-5 are Field-Effect Transistors (FET), any other types of transistors, e.g. Metal-Oxide-Semiconductor FET (MOSFET), Junction FET (JFET), etc., may be comprised in the passable latch circuit PL 100, 300, two- or M-phase retiming unit C2 400, Cm 500.

When using the word "comprise" or "comprising" it shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. A passable latch circuit (PL) comprising:
   a dynamic latch comprising a first P-transistor, a first N-transistor, a second P-transistor, a second N-transistor, and clock input circuitry,
   wherein:
   sources of the first and second P-transistors are connected to a first voltage,
   sources of the first and second N-transistors are connected to a second voltage,
   gates of the first P-transistor and the first N-transistor are connected to a data input,
   drains of the second P-transistor and the second N-transistor are connected to a data output,
   a drain of the first P-transistor is connected to a gate of the second P-transistor,
   a drain of the first N-transistor is connected to a gate of the second N-transistor, and
   the clock input circuitry is connected between the gates of the second P-transistor and the second N-transistor such that:
      a first node of the clock input circuitry is connected to the drain of the first P-transistor and the gate of the second P-transistor,
      a second node of the clock input circuitry is connected to the drain of the first N-transistor and the gate of the second N-transistor, and
      a control switch connected between the gates of the second P-transistor and the second N-transistor, wherein the control switch has an on state and an off state, and the passable latch circuit is configured to have different delays by controlling the state of the control switch, wherein the clock input circuitry comprises a plurality of M clock input branches, and wherein each clock input branch comprises a first N-transistor and a second N-transistor connected in series between the first and second nodes of the clock input circuitry.

2. The passable latch circuit according to claim 1, wherein the passable latch circuit can be configured to provide a pass delay or a clocked delay depending on the state of the control switch.

3. The passable latch circuit according to claim 1, wherein the control switch comprises any one of: an N-transistor, a P-transistor or a transmission gate.

4. The passable latch circuit according to claim 1, wherein the passable latch circuit is a multiple M-phase retiming unit, wherein
   a gate of the first N-transistor is connected to a respective clock signal input; and
   a gate of the second N-transistor is connected to a respective control signal input; and wherein:
   a clock input branch is selected by controlling the states of the control signal inputs such that different clocks are provided to the M-phase retiming unit which give different delays.

5. The passable latch circuit according to claim 4, wherein M=2 and the multiple M-phase retiming unit is a 2-phase retiming unit.

6. The passable latch circuit according to claim 1, further comprising a holding circuit.

7. A variable delay chain comprising:
   two or more passable latch circuits according to claim 1; and
   a controller configured to generate delay control signals for controlling the variable delay chain by controlling the state of the control switches in the two or more passable latch circuits.

8. The variable delay chain according to claim 7, further comprising at least one multiple M-phase retiming unit, wherein the controller is further configured to select a clock input branch by controlling the states of control signal inputs in the at least one multiple M-phase retiming unit.

9. The variable delay chain according to claim 7, wherein the variable delay chain is divided into two or more segments, and wherein a last retiming unit in each segment is configured to provide a clocked delay.

10. The variable delay chain according to claim 9, wherein a last segment comprises a fine adjustment unit.

11. The variable delay chain according to claim 10, wherein the fine adjustment unit is implemented by one of:
    an analog variable delay circuit; and
    a passable latch circuit comprising:
       a dynamic latch comprising a first P-transistor, a first N-transistor, a second P-transistor, a second N-transistor, and clock input circuitry,
    wherein:
       sources of the first and second P-transistors are connected to a first voltage,
       sources of the first and second N-transistors are connected to a second voltage,
       gates of the first P-transistor and the first N-transistor are connected to a data input,
       drains of the second P-transistor and the second N-transistor are connected to a data output,
       a drain of the first P-transistor is connected to a gate of the second P-transistor,
       a drain of the first N-transistor is connected to a gate of the second N-transistor; and
       the clock input circuitry is connected between the gates of the second P-transistor and the second N-transistor such that:
          a first node of the clock input circuitry is connected to the drain of the first P-transistor and the gate of the second P-transistor;

a second node of the clock input circuitry is connected to the drain of the first N-transistor and the gate of the second N-transistor; and a control switch connected between the gates of the second P-transistor and the second N-transistor, wherein the control switch has an on state and an off state, and the passable latch circuit is configured to have different delays by controlling the state of the control switch.

12. The variable delay chain according to claim 10, wherein the fine adjustment unit is implemented by delaying the clock signal used to trigger data in the fine adjustment unit.

13. A multiple-bit data delay path comprising a plurality of variable delay chains according to claim 7, wherein each variable delay chain is configured to delay one bit of multiple-bit data.

14. An electronic device comprising a variable delay chain according to claim 7.

15. The electronic device according to claim 14, further comprising any one of a digital logic circuit, a receiver, a transmitter, a transceiver, a wireless communication device, a base station, a user equipment, a computer, and a processor.

16. An electronic device comprising a multiple-bit data delay path according to claim 13.

* * * * *